(12) United States Patent
Sakui

(10) Patent No.: US 10,090,052 B2
(45) Date of Patent: *Oct. 2, 2018

(54) SEQUENTIAL WRITE AND SEQUENTIAL WRITE VERIFY IN MEMORY DEVICE

(71) Applicant: Micron Technology, Inc., Boise, ID (US)

(72) Inventor: Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/849,299

(22) Filed: Dec. 20, 2017

(65) Prior Publication Data

US 2018/0137917 A1   May 17, 2018

Related U.S. Application Data

(63) Continuation of application No. 14/581,631, filed on Dec. 23, 2014, now Pat. No. 9,881,674.

(60) Provisional application No. 62/090,495, filed on Dec. 11, 2014.

(51) Int. Cl.
| | | |
|---|---|---|
| *G11C 16/04* | (2006.01) | |
| *G11C 16/30* | (2006.01) | |
| *G11C 16/10* | (2006.01) | |
| *G11C 16/34* | (2006.01) | |
| *G11C 11/56* | (2006.01) | |

(52) U.S. Cl.
CPC ...... *G11C 16/0483* (2013.01); *G11C 11/5628* (2013.01); *G11C 16/10* (2013.01); *G11C 16/30* (2013.01); *G11C 16/3459* (2013.01)

(58) Field of Classification Search
CPC . G11C 16/14; G11C 11/5635; G11C 16/0483; G11C 16/3459
USPC .................................................. 365/185.03
See application file for complete search history.

(56) References Cited

U.S. PATENT DOCUMENTS

| 7,280,398 | B1 | 10/2007 | Lee | |
|---|---|---|---|---|
| 8,345,482 | B2 | 1/2013 | Hoei | |
| 2007/0263462 | A1* | 11/2007 | Roohparvar | G11C 16/0483 365/198 |
| 2008/0123408 | A1 | 5/2008 | Honma et al. | |
| 2009/0052243 | A1 | 2/2009 | Park et al. | |
| 2009/0323431 | A1* | 12/2009 | Chun | G11C 11/5628 365/185.22 |
| 2010/0097862 | A1 | 4/2010 | Kang et al. | |
| 2016/0172041 | A1 | 6/2016 | Sakui | |

* cited by examiner

*Primary Examiner* — Tha-O H Bui
(74) *Attorney, Agent, or Firm* — Shwegman Lundberg & Woessner, P.A.

(57) ABSTRACT

Some embodiments include apparatuses and methods for performing a first stage of an operation of storing information in a first memory cell and a second memory cell, and performing a second stage of the operation after the first stage to determine whether each of the first and second memory cells reaches a target state. The first memory cell is included in a first memory cell string coupled to a data line through a first select transistor. The second memory cell is included in a second memory cell string coupled to the data line through a second select transistor.

20 Claims, 10 Drawing Sheets

US 10,090,052 B2

SEQUENTIAL WRITE AND SEQUENTIAL WRITE VERIFY IN MEMORY DEVICE

PRIORITY APPLICATION

This application is a continuation of U.S. application Ser. No. 14/581,631, filed Dec. 23, 2014, now issued as U.S. Pat. No. 9,881,674, which claims the benefit of priority to U.S. Provisional Application Ser. No. 62/090,495, filed Dec. 11, 2014, all of which are incorporated herein by reference in their entireties.

BACKGROUND

Memory devices, such as flash memory, are widely used in computers and many electronic items. A flash memory device has numerous memory cells. Information can be stored in the memory cells in a write operation. The stored information can be obtained from the memory cells in a read operation. Some applications that use these memory devices may have specific timing margin and power consumption preferences. In some conventional memory devices, meeting such references may pose a challenge.

DETAILED DESCRIPTION

Figure 1:
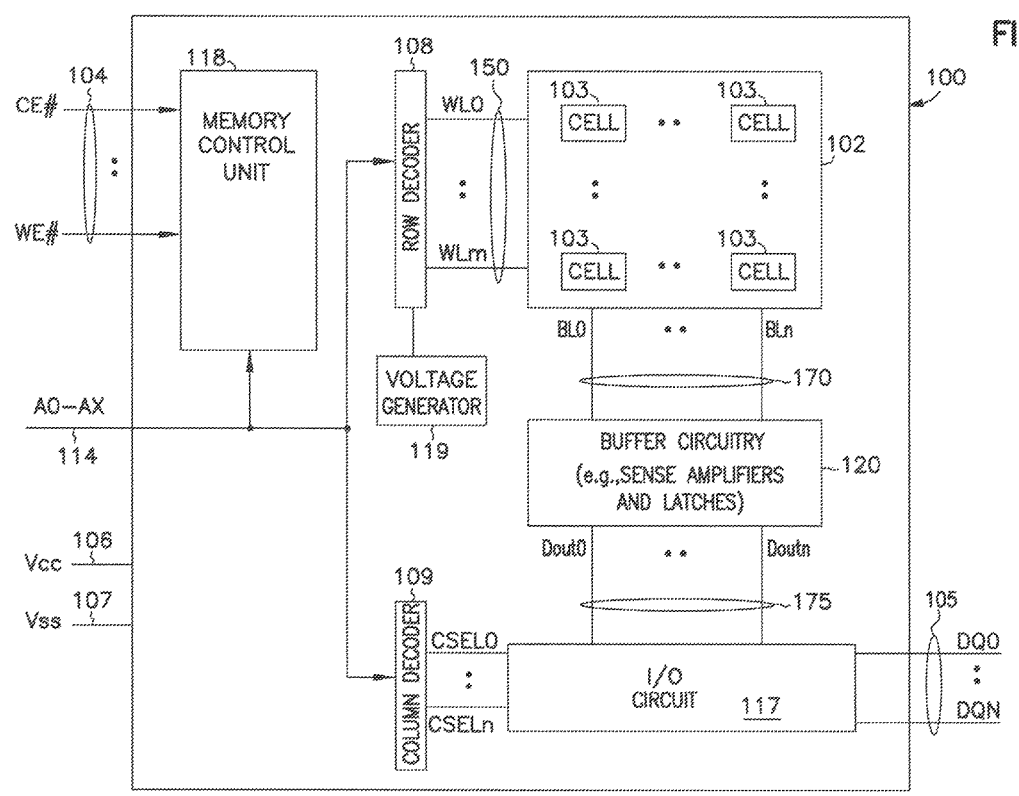
FIG. 1 shows a block diagram of an apparatus in the form of a memory device having a memory array, memory cells, access lines, and data lines, according to an embodiment of the invention.

FIG. 1 shows a block diagram of an apparatus in the form of a memory device 100 having a memory array 102, memory cells 103, access lines 150, and data lines 170, according to an embodiment of the invention. Access lines 150 can include word lines of memory device 100 and can be configured to carry signals (e.g., word line signals) WL0 through WLm. Data lines 170 can include bit lines of memory device 100 and can be configured to can carry signals (e.g., bit line signals) BL0 through BLn.

Memory device 100 may use access lines 150 to access memory cells 103 during memory operations, and use data lines 170 to exchange information (e.g., data) with memory cells 103. A row decoder 108 and a column decoder 109 decode address signals A0 through AX on lines 114 (e.g., address lines) to determine which memory cells 103 are to be accessed in a memory operation.

Memory device 100 can perform memory operations such as a read operation to obtain information stored in memory cells 103, a write (e.g., programming) operation to write (e.g., program) information to memory cells 103, and an erase operation to clear information from some or all of memory cells 103.

A memory control unit 118 can be configured to control memory operations of memory device 100 based on control signals on lines 104. Examples of the control signals on lines 104 include one or more clock signals and other signals (e.g., a chip enable signal CE#, a write enable signal WE#) to indicate which operation (e.g., a read, write, or erase operation) memory device 100 can perform.

Other devices external to memory device 100 (e.g., a memory access device, such as a processor or a memory controller) can control the values of the control signals on lines 104. Specific values of a combination of the signals on lines 104 can produce a command (e.g., read, write, or erase command) that can cause memory device 100 to perform a corresponding memory operation (e.g., read, write, or erase operation).

Memory device 100 can include buffer circuitry (e.g., a page buffer circuit) 120 that can include components such as sense amplifiers and latches (e.g., data latches). Buffer circuitry 120 can operate to determine the value of information obtained from memory cells 103 (e.g., during a read operation) and provide the value of the information in the form of signals Dout0 through Doutn to lines 175 (e.g., part of data lines of memory device 100). Buffer circuitry 120 can also use the signals on lines 175 to determine the value of information to be stored (e.g., programmed) in memory cells 103 (e.g., during a write operation).

Memory device 100 can include an input/output (I/O) circuit 117 to exchange information between memory array 102 and lines (e.g., I/O lines) 105. Column decoder 109 can selectively activate the CSEL0 through CSELn signals based on address signals A0 through AX on lines 114. I/O circuit 117 can respond to signals CSEL0 through CSELn to select the signals on lines 175 that can represent the information obtained from or written to memory cells 103.

Signals DQ0 through DQN on lines 105 can represent information obtained from or written in memory cells 103. Lines 105 can include nodes within memory device 100 or pins (or solder balls) on a package where memory device 100 can reside. Other devices external to memory device 100 (e.g., a memory controller or a processor) can communicate with memory device 100 through lines 104, 105, and 114.

Each of memory cells 103 can be configured to store information representing a value of a fraction of a bit, a value of a single bit, or a value of multiple bits such as two, three, four, or another number of bits. For example, each of memory cells 103 can be configured as a single level cell (SLC) to store information representing a binary value "0" or "1" of a single bit. In another example, each of memory cells 103 can be configured as a multi-level cell (MCL) to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits.

Memory device 100 can receive supply voltages Vcc and Vss, on lines 106 and 107, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry. Memory device 100 can also include a voltage generator 119 to provide different voltages to access lines 150 during operations (e.g., read, write, and erase operations) of memory device 100.

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive random access memory (RAM) device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1 so as not to obscure the embodiments described herein.

Memory device 100 may include memory devices and operate using memory operations (e.g., read, write, and erase operations) similar to or identical to memory devices and operations described below with reference to FIG. 2A through FIG. 8.

Figure 2A:
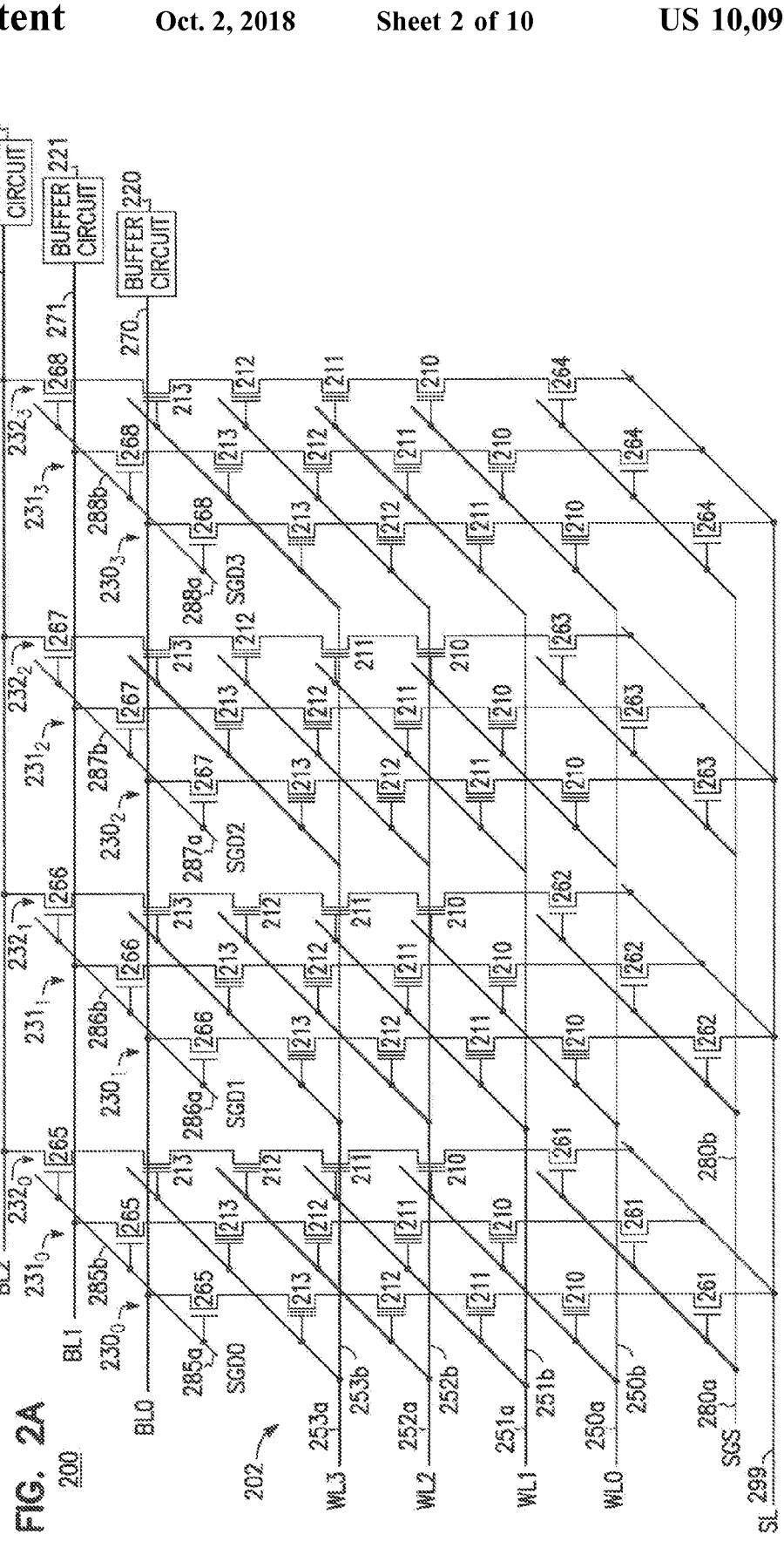
FIG. 2A shows a schematic diagram of a portion of a memory device including a memory array having memory cells, and data lines coupled to buffer circuits, according to an embodiment of the invention.

FIG. 2A shows a schematic diagram of a portion of a memory device 200 including a memory array 202 having memory cells 210, 211, 212, and 213, and data lines 270, 271, and 272 coupled to buffer circuits 220, 221, and 222, according to an embodiment of the invention. Memory array 202 can correspond to memory array 102 of FIG. 1. Buffer circuits 220, 221, and 222 can be part of buffer circuitry of memory device 200 that can correspond to buffer circuitry 120 of FIG. 1. Buffer circuitry 120 can operate to determine the value of information obtained from memory cells 210, 211, 212, and 213 or the value of information to be stored in memory cells 210, 211, 212, and 213.

As shown in FIG. 2A, data lines 270, 271, and 272 can carry signals BL0, BL1, and BL2, respectively. Each of data lines 270, 271, and 272 can be structured as a conductive line of memory device 200. Memory device 200 can include line 299, which can be structured as a conductive line that can form part of a source (e.g., a source line) of memory device 200. Line 299 can carry a signal SL (e.g., source signal). Memory device 200 can include access lines 250a, 251a, 252a, and 253a that can carry corresponding signals (e.g., word line signals) WL0, WL1, WL2, and WL3. Memory device 200 can include control gates 250b, 251b, 252b, and 253b that can be part of access lines 250a, 251a, 252a, and 253a, respectively. FIG. 2A shows four access lines 250a, 251a, 252a, and 253a and three data lines 270, 271, and 272 as an example. The number of such access lines and data lines can vary.

Memory device 200 can include select transistors 261, 262, 263, and 264 (bottom part of FIG. 2A) and select transistors 265, 266, 267, and 268 (top part of FIG. 2A). Memory cells 210, 211, 212, and 213 can be arranged in memory cell strings, such as memory cell strings $230_0$, $230_1$, $230_2$, $230_3$, $231_0$, $231_1$, $231_2$, $231_3$, $232_0$, $232_1$, $232_2$, and $232_3$. For brevity, these memory cell strings are collectively referred to as memory cell string $230_0$ through $232_3$. Each of memory cells 210, 211, 212, and 213 can be configured as a single level cell or a multi-level cell.

Each of memory cell string $230_0$ through $232_3$ can be coupled to one of data lines 270, 271, and 272 through one of select transistors 265, 266, 267, and 268. Each of memory cell string $230_0$ through $232_3$ can also be coupled to line 299 through one of select transistors 261, 262, 263, and 264. For example, memory cell string $230_0$ can be coupled to data line 270 through select transistor 265 (directly over string $230_0$) and to line 299 through select transistor 261 (directly under string $230_0$). In another example, memory cell string $230_1$ can be coupled to data line 270 through select transistor 266 (directly over string $230_1$) and to line 299 through select transistor 262 (directly under string $230_1$). FIG. 2A shows an example of 12 memory cell strings $230_0$ through $232_3$ and four memory cells 210, 211, 212, and 213 in each memory cell string. The number of such memory cell strings and the number of memory cells in each memory cell string can vary.

As shown in FIG. 2A, some memory cells (e.g., 212) of memory cell strings $230_0$ through $232_3$ can share the same control gate (e.g., 252b). Some other memory cells (e.g., 213) of memory cell strings $230_0$ through $232_3$ can share another control gate (e.g., 253b). Each of control gates 250b, 251b, 252b, and 253b can be structured as a single conductive plate. Thus, in the example shown in FIG. 2A, memory device 200 can include four conductive plates that form four control gates 250b, 251b, 252b, and 253b.

Select transistors 261, 262, 263, and 264 can share the same gate 280b. Gate 280b can form part of a select line (e.g., source select line) 280a of memory device 200. Select transistors 261, 262, 263, and 264 can be controlled (e.g., turned on or turned off) by the same signal, such as an SGS signal (e.g., source select gate signal) applied to select line 280a. During a memory operation, such as a read or write operation, select transistors 261, 262, 263, and 264 can be turned on (e.g., by activating SGS signal) to couple memory cell strings $230_0$ through $232_3$ to line 299. Select transistors 261, 262, 263, and 264 can be turned off (e.g., by deactivating the SGS signal) to decouple the memory cell strings $230_0$ through $232_3$ from line 299.

Select transistors 265, 266, 267, and 268 can include separate gates (e.g., separate drain select gates) 285b, 286b, 287b, and 288b. However, select transistors 265 can share the same gate 285b. Select transistors 266 can share the same gate 286b. Select transistors 267 can share the same gate 287b. Select transistors 268 can share the same gate 288b. Gates 285b, 286b, 287b, and 288b can form part of select lines (e.g., drain select lines) 285a, 286a, 287a, and 288a, respectively, of memory device 200.

Select transistors 265, 266, 267, and 268 can be controlled (e.g., turned on or turned off) by corresponding signals SGD0, SGD1, SGD2, and SGD3 (e.g., drain select gate signals) during a memory operation (e.g., a read or write operation) in order to selectively couple memory cell strings $230_0$ through $232_3$ to their respective data lines 270, 271, and 272. During a memory operation (e.g., a read or write operation), only one of the signals SGD0, SGD1, SGD2, and SGD3 can be activated at a time (e.g., sequentially activated).

For example, during a write operation of storing information in a selected memory cell of memory cell strings $230_0$, $231_0$, or $232_0$, signal SGD0 can be activated to turn on select transistors 265 and couple memory cell strings $230_0$, $231_0$, and $232_0$ to data lines 270, 271, and 272, respectively. Signals SGD1, SGD2, and SGD3 can be deactivated (while signal SGD0 is activated) to decouple memory cell strings $230_1$, $231_1$, $232_1$, $230_2$, $231_2$, $232_2$, $230_3$, $231_3$, and $232_3$ from data lines 270, 271, and 272.

In another example, during a write operation of storing information in a selected memory cell of memory cell strings $230_1$, $231_1$, or $232_1$, signal SGD1 can be activated to turn on select transistors 266 and couple memory cell strings $230_1$, $231_1$, and $232_1$ to data lines 270, 271, and 272, respectively. Signals SGD0, SGD2, and SGD3 can be deactivated (while signal SGD1 is activated) to decouple memory cell strings $230_0$, $231_0$, $232_0$, $230_2$, $231_2$, $232_2$, $230_3$, $231_3$, and $232_3$ from data lines 270, 271, and 272.

Figure 6:
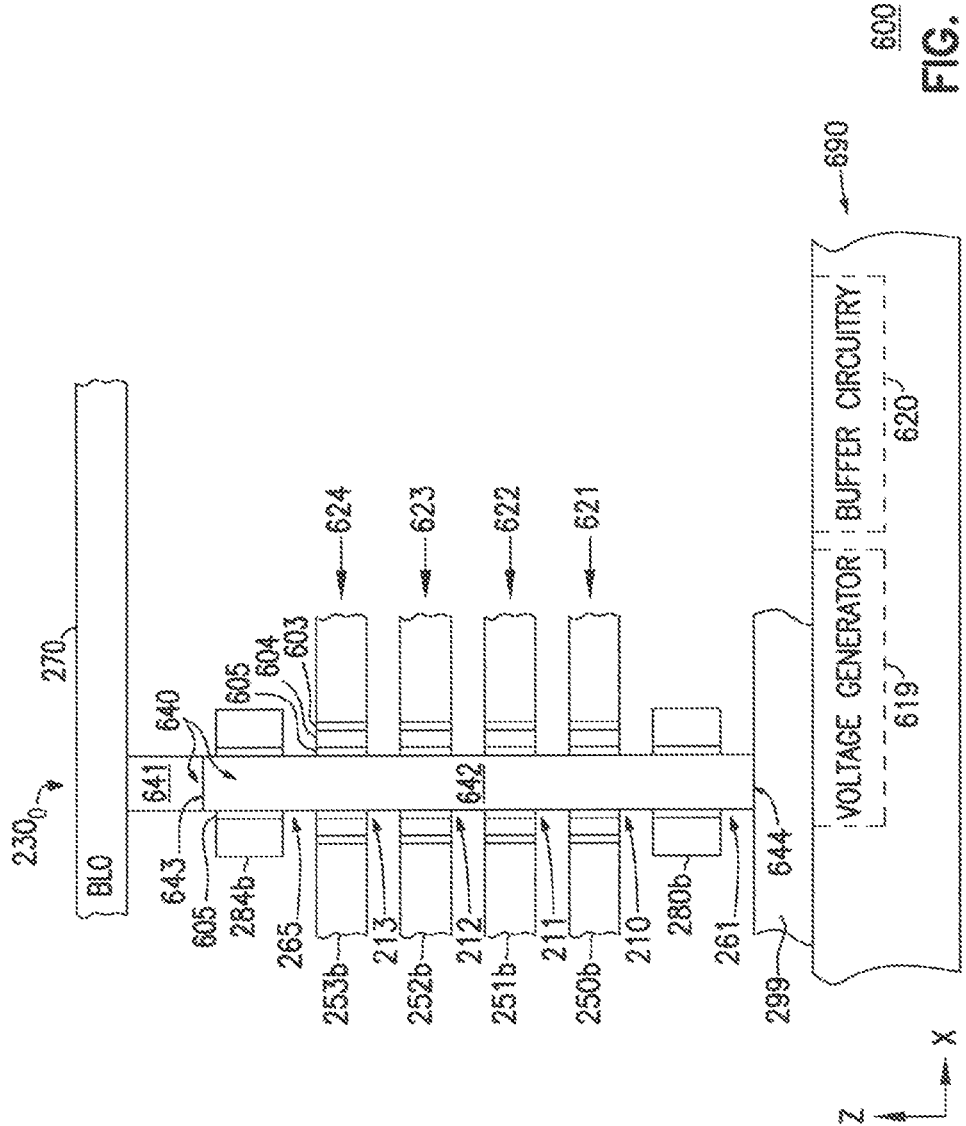
FIG. 6 shows a side view of a structure of a portion of a memory device including memory cells arranged in different levels of the device, according to an embodiment of the invention.
Figure 7:
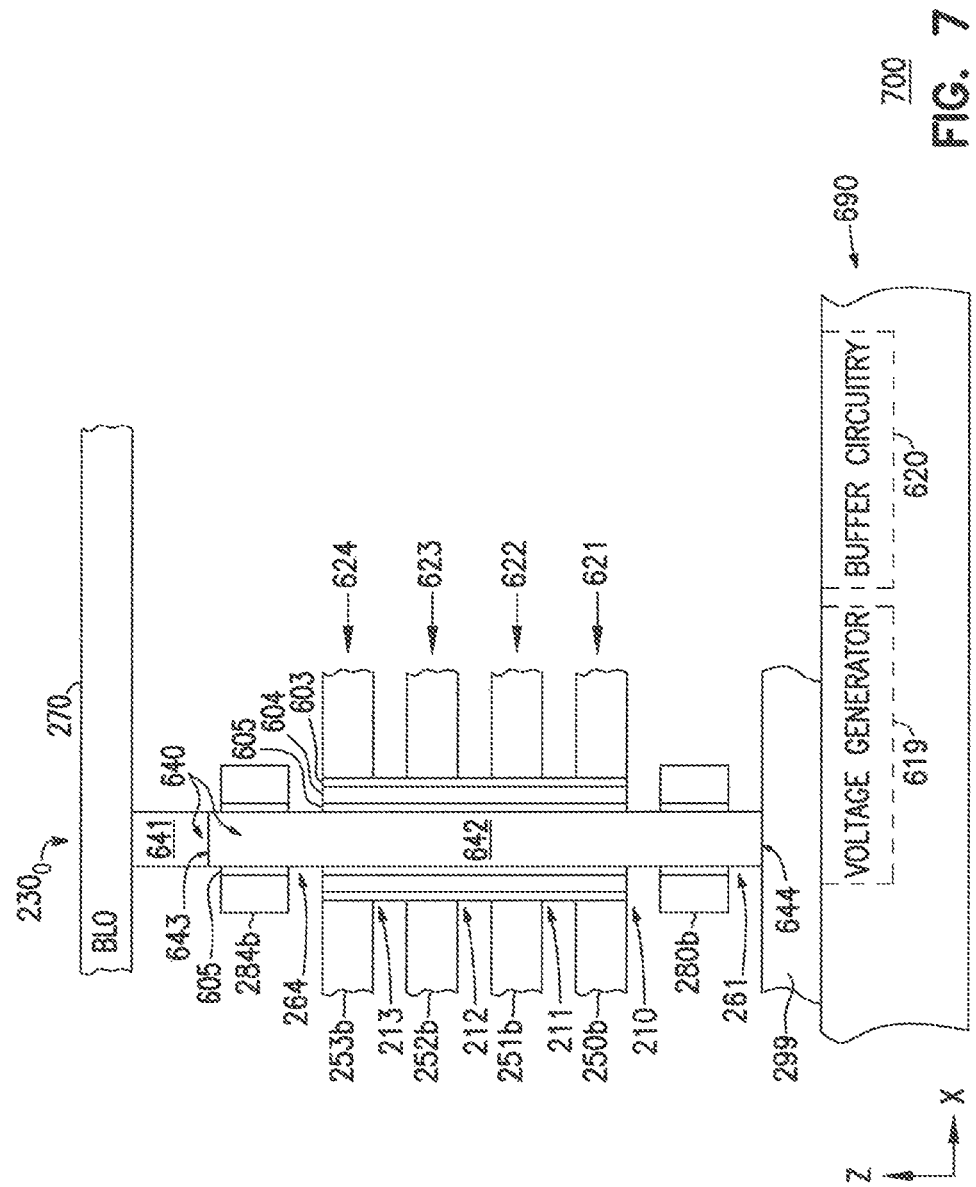
FIG. 7 shows a variation of the memory device of FIG. 6, according to an embodiment of the invention.

Memory cells 210, 211, 212, and 213 can be physically located in multiple levels of memory device 200, such that memory cells 210, 211, 212, and 213 in the same memory cell string can be stacked over each other (e.g., vertical stacked memory cells) in multiple levels of memory device 200. FIG. 6 and FIG. 7 show example structures of memory devices having stacked memory cells that can correspond to memory cells 210, 211, 212, and 213 of memory device 200.

Figure 2B:
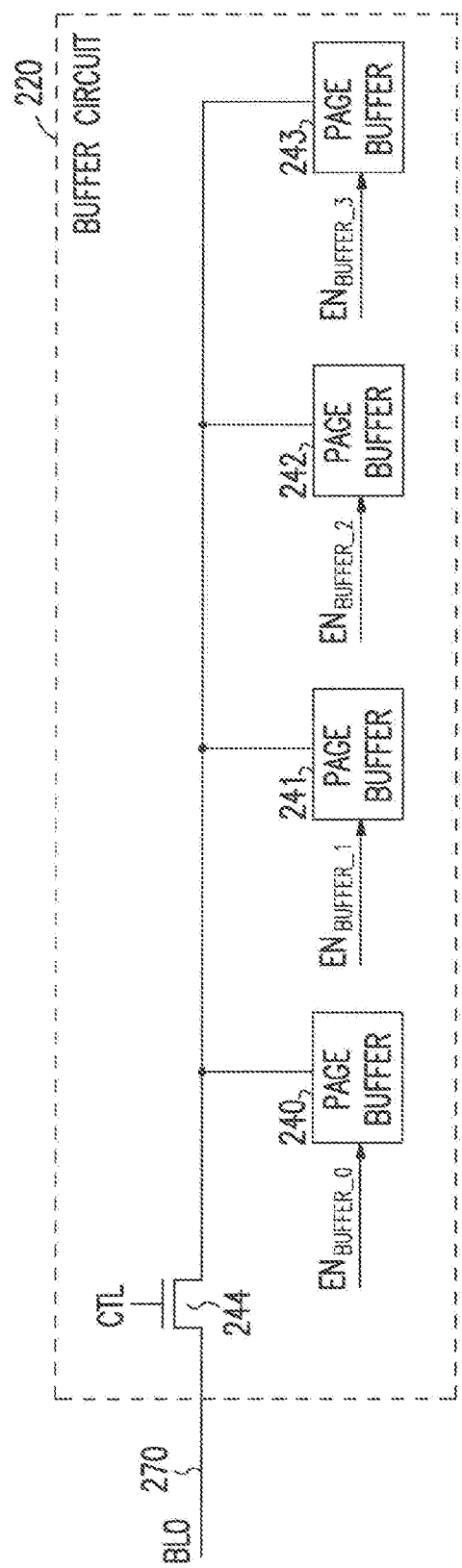
FIG. 2B shows a schematic diagram of one of the buffer circuits of the memory device of FIG. 2A, according to an embodiment of the invention.

FIG. 2B shows a schematic diagram of buffer circuit 220 of FIG. 2A, according to an embodiment of the invention. As shown in FIG. 2B, buffer circuit 220 can include page buffers 240, 241, 242, and 243 coupled to data line 270 through a transistor 244. Although not shown in FIG. 2B, other circuit elements, such as sense amplifier circuitry, can be included in buffer circuit 220 to perform sensing functions during a memory operation (e.g., a read or write operation) of memory device 200, such as a read, write, or write verify operation. Each of page buffers 240, 241, 242, and 243 can include a latch (e.g., data latch) to hold a value (e.g., a bit) of information (e.g., data). Such information can be information obtained from or to be stored in selected memory cells among memory cells 210, 211, 212, and 213 of memory cell strings $230_0$, $230_1$, $230_2$, and $230_3$ (FIG. 2A) coupled to data line 270.

In FIG. 2B, signals $EN_{BUFFER\_0}$, $EN_{BUFFER\_1}$, $EN_{BUFFER\_2}$, and $EN_{BUFFER\_3}$ can be sequentially activated (e.g., activated one at time) to exchange information (e.g., data) with data line 270 during a read or write operation. Transistor 244 can operate (e.g., can be turned on) to pass information between data line 270 and the activated page buffer (one of page buffers 240, 241, 242, and 243, depending on which of page buffers 240, 241, 242, and 243 is activated). For example, to pass information (provided by signal BL0) from data line 270 to page buffer 240, transistor 244 can be turned on and signal $EN_{BUFFER\_0}$ can be activated while signals $EN_{BUFFER\_1}$, $EN_{BUFFER\_2}$, and $EN_{BUFFER\_3}$ are deactivated. In another example, to pass the information (provided by signal BL0) from data line 270 to page buffer 241, transistor 244 can be turned on and signal $EN_{BUFFER\_1}$ can be activated while signals $EN_{BUFFER\_0}$, $EN_{BUFFER\_2}$, and $EN_{BUFFER\_3}$ are deactivated.

Buffer circuits 221 and 222 (FIG. 2A) can include similar or identical elements (e.g., transistors and page buffers) and operate in a manner similar to or identical to that of buffer circuit 220. For simplicity, details of buffer circuits 221 and 222 are not shown and described herein.

Figure 3A:
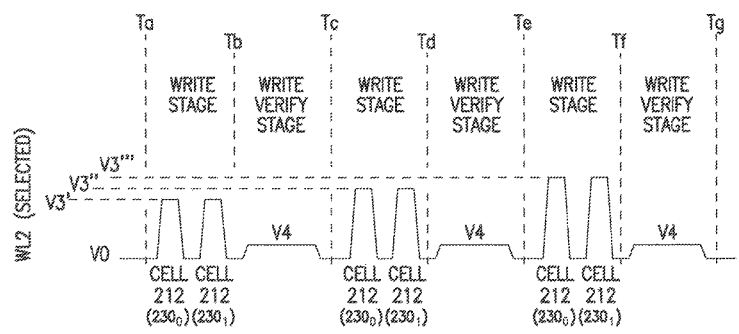
FIG. 3A is a timing diagram for a signal on a selected access line during an example operation of storing information in two memory cells of the memory device of FIG. 2A, according to an embodiment of the invention.

FIG. 3A is a timing diagram for signal WL2 on selected access line 252a during an example write operation of storing information in selected memory cells of memory cell strings $230_0$ and $230_1$ of memory device of FIG. 2A, according to an embodiment of the invention.

The write operation of memory device 200 can include a write stage (e.g., program stage) and a write verify stage (e.g., program verify stage) performed after the write stage. In the write stage, memory device 200 sequentially stores information (e.g., sequentially programs) in multiple memory cells of different memory cell strings that are coupled to the same data line. After the write stage, memory device 200 performs the write verify stage to determine (e.g., verify) whether the multiple memory cells (that were programmed in the write stage) reach a target state.

The example write operation associated with FIG. 3A assumes that memory cells 212 of memory cell strings $230_0$ and $230_1$ (associated with data line 270) are selected memory cells to store information. In FIG. 3A, Ta, Tb, Tc, Td, Te, Tf, and Tg represent different times. Memory device 200 can perform a write stage during a time interval between times Ta and Tb and a write verify stage during a time interval between times Tb and Tc. Between times Ta and Tb (write stage), memory device 200 can sequentially store (e.g., program) information in memory cells 212 of memory cell strings $230_0$ and $230_1$. Between times Tb and Tc (write verify stage), memory device 200 can determine whether each of memory cells 212 of memory cell strings $230_0$ and $230_1$ reaches a target state. In a write stage, signal WL2 can be provided with a voltage V3' (e.g., a programming voltage) at specific time intervals. In a write verify stage, signal WL2 can be provided with a voltage V4 (e.g., a program verify voltage).

After the write verify stage is performed between times Tb and Tc, memory device 200 may stop programming memory cells 212 of memory cell strings $230_0$ and $230_1$ to a target state if memory cells 212 of memory cell strings $230_0$ and $230_1$ reach (or are deemed to reach) the target state.

If memory cells 212 of memory cell string $230_0$ and $230_1$ do not reach the target state after the write verify stage is performed between times Tb and Tc, memory device 200 may repeat at least one combination of the write and write verify stages (e.g., the stages between times Tc and Te, and between times Te and Tg) until memory cells 212 of memory cell string $230_0$ and $230_1$ reach the target state.

As shown in FIG. 3A, the value of voltage V4 provided by signal WL2 (applied to access line 252a of FIG. 2A) can remain unchanged within a write verify stage and unchanged from write verify stage to another write verify stage. However, each time a write stage is repeated, the value of the voltage provided by signal WL2 (applied to access line 252a of FIG. 2A) may be increased (e.g., may be stepped up by an amount of 300 mV to 500 mV each time) from the value of voltage V3' to V3" or from V3" to V3"'.

In a write stage in the example of FIG. 3A, memory device 200 may change (e.g., increase) a value of the threshold voltage of each of memory cells 212 of memory cell strings $230_0$ and $230_1$ based on the value of information to be stored in each of these memory cells 212. For example, before the write stage is performed, the threshold voltage of each of memory cells 212 of memory cell strings $230_0$ and $230_1$ may have a negative value (e.g., negative value corresponding to an erase state). In the write stage, memory device 200 may change the value of the threshold voltage of each of memory cells 212 of memory cell strings $230_0$ and $230_1$ from a negative value to a positive value that corresponds to a target state, which is different from an erase state. In a write verify stage, memory device 200 may compare the value (e.g., the programmed value) of the threshold voltage of the memory cell (each of memory cells 212 of memory cell strings $230_0$ and $230_1$) to a known value (e.g., a target threshold voltage value) in order to determine whether the memory cell reaches a target threshold voltage value.

As described above, memory cells 210, 211, 212, and 213 of memory device 200 may be configured as a SLC or MLC. In the example associated with FIG. 3A, if memory cells 210, 211, 212, and 213 of memory device 200 are configured as a single level cell, then the target state (e.g., target threshold voltage) of each of memory cells 212 of memory cell strings $230_0$ and $230_1$ can correspond to a value of a single bit of data to be stored in each of memory cells 212 of memory cell strings $230_0$ and $230_1$.

If each of memory cells 212 of memory cell strings $230_0$ and $230_1$ is configured as a multi-level cell, then the target state of each of memory cells 212 of memory cell strings $230_0$ and $230_1$ can correspond to a value of one bit among the multiple bits (bits belonging to a lower page or an upper page) to be stored in each of memory cells 212 of memory cell strings $230_0$ and $230_1$.

Memory device 200 can store information in memory cells 210, 211, 212, and 213 in pages (e.g., lower page and upper page). Each page (e.g., each lower page or each upper page) can include a group of bits stored in a group of memory cells. In FIG. 2A, memory cells 210, 211, 212, and 213 can be sequentially addressed, such that each memory cell of the memory cell strings sharing the same access line and coupled to the same data line can be sequentially programmed to store bits belonging to different pages of information. For example, each of memory cells 212 of memory cell strings $230_0$, $230_1$, $230_2$, $230_3$ (coupled to the same data line 270) can store a bit that belonged to a lower page and store another bit that belonged to an upper page.

In some situations, memory device 200 may perform the write and write verify stages, as described above, during storing bits in selected memory cells (memory cells 212 of memory cell strings $230_0$ and $230_1$) in which the bits belonged to only a certain page (e.g., only a lower page) and not all pages of information to be stored in the selected memory cells. Such situations may occur when the number of page buffers (e.g., page buffers 240 through 243 in FIG. 2B) coupled to the same data line may be insufficient for memory device 200 to perform the write and write verify stages during storing bits that belonged to a certain page (e.g., upper page) of information.

FIG. 3A shows an example where two memory cells can be sequentially programmed in a write stage of a write operation. However, more than two memory cells can be programmed in a write stage.

Figure 3B:
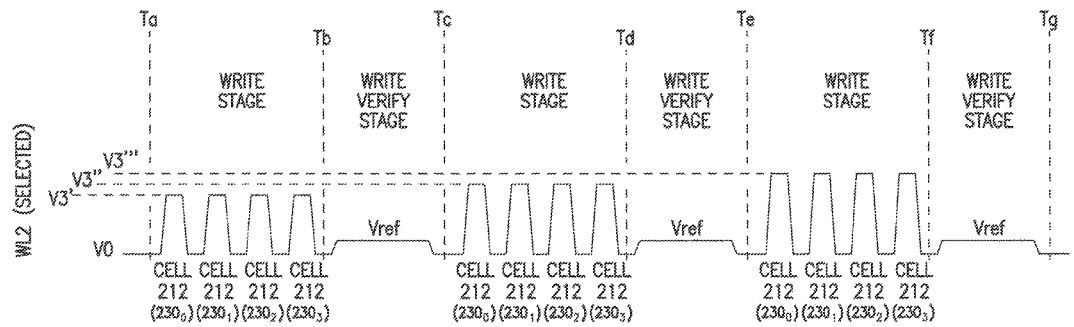
FIG. 3B is a variation of the example write operation associated with FIG. 2A, according to an embodiment of the invention.

FIG. 3B is a variation of the example write operation associated with FIG. 2A, according to an embodiment of the invention. The example write operation of FIG. 3B is similar to that of the example write operation of FIG. 3A. However, in FIG. 3B, four memory cells (instead of two as in FIG. 3A) can be sequentially programmed in a write stage before a write verify stage is performed to determine whether the four memory cells reach a target stage. The four memory cells in the example of FIG. 3B can include memory cells 212 of memory cell string $230_0$, $230_1$, $230_2$, and $230_3$ (FIG. 2A). These memory cells 212 can be sequentially programmed when signal WL2 (FIG. 3B) is provided with a voltage V3' during a write stage between times Ta and Tb. A write verify stage between times Tb and Tc can determine whether memory cells 212 (that were programmed between times Ta and Tb) reach a target state. If these memory cells 212 do not reach the target state, memory device 200 may repeat at least one combination of the write and write verify stages (e.g., between times Tc and Te and between times Te and Tg) until these memory cells 212 reach the target state.

Some conventional techniques may program a memory cell and then immediately determine (e.g., verify) whether that memory cell reaches a target state before programming another memory cell. The write operation (e.g., write operations associate with FIG. 3A and FIG. 3B) in a memory device (e.g., memory device 200) described herein may improve performance of the memory device over some conventional memory devices. For example, sequentially programming multiple memory cells (e.g., in the same write stage) and then sequentially determining whether those multiple memory cells reach a target state in another stage (e.g., in the same write verify stage), as described above in the example of FIG. 3A and FIG. 3B, may reduce programming time, reduce power consumption, or both, in comparison with some conventional memory devices.

Figure 4A:
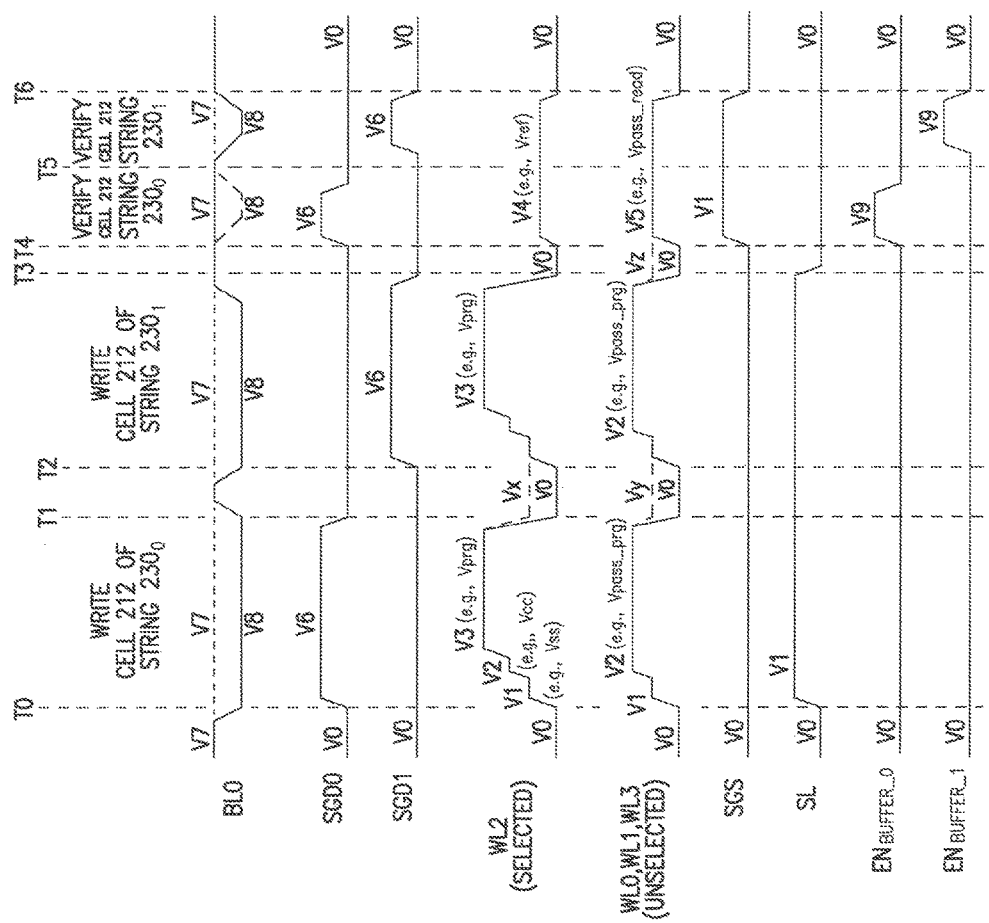
FIG. 4A is a timing diagram for some signals during an example write operation of storing information in selected memory cells of the memory device of FIG. 2A and FIG. 2B, according to an embodiment of the invention.

FIG. 4A is a timing diagram for some signals during an example write operation of storing information in selected memory cells of memory device 200 of FIG. 2A and FIG. 2B, according to an embodiment of the invention. The example write operation associated with FIG. 4A assumes that memory cells 212 of memory cell strings $230_0$ and $230_1$ are selected memory cells.

FIG. 4A shows different times T0 through T6. Memory device 200 can perform a write stage during a time interval between times T0 and T3. Memory device 200 can perform a write verify stage during a time interval between times T4 and T6. The write and write verify stages between times T0 and T6 can correspond to the write and write verify stages between times Ta and Tc (FIG. 3A), between times Tc and Te, or between times Te and Tg.

Voltages V0 through V8 are different voltages that can be provided by a corresponding signal in FIG. 4A. Voltage V0 can be a ground potential (having a value of approximately zero volts, such as Vss in FIG. 1). Voltage V1 can have a value corresponding to a supply voltage (e.g., Vcc) of memory device 200. Voltage V1 can have a value of approximately 5V. Voltage V2 (e.g., Vpass_prg) can have a value in a range of 8V to 11V. Voltage V3 can include a programming voltage (e.g., Vprg) used to program a selected memory cell during a write stage. Voltage V3 can correspond to voltage V3', V3", or V3''' of FIG. 3A (where V3'<V3"<V3'''). Voltage V3 of FIG. 4A can have a value in the range of 15V to 18V. Voltage V4 can have a value in the range of 0.5V to 4.5V and can correspond to voltage Vref of FIG. 3A. Voltage V5 (e.g., Vpass_read) have a value in a range of 7V to 9V. Voltages V6, V7, and V9 can have a value corresponding to a supply voltage (e.g., Vcc) of memory device 200. Voltage V8 can have a value of zero (e.g., Vss). Voltage V2 can also be increased (e.g., stepped up by a voltage amount) each time a write stage is repeated. For example, as mentioned above, voltage V3 can correspond to voltage V3', V3", or V3''' of FIG. 3A. Similarly, voltage V2 of FIG. 4A can be one of voltages V2', V2", and V2''' (not shown in FIG. 3A and FIG. 4A) where V2'<V2"<V2'''. For example, if voltage V3 of FIG. 4A corresponds to voltage V3' (FIG. 3A), then voltage V2 can correspond to voltage V2; if voltage V3 corresponds to voltage V3", then voltage V2 can correspond to voltage V2"; if voltage V3 corresponds to V3''', then voltage V2 can correspond to voltage V2'''.

In FIG. 4A, between times T0 and T3 (write stage), memory device 200 can sequentially store information in (e.g., sequentially program) memory cells 212 of memory cell strings $230_0$ and $230_1$. For example, between times T0 and T1, memory device 200 can program memory cell 212 of memory cell strings $230_0$ when voltage V3 (provided by signal WL2) is applied to access line 252a. Between times T2 and T3 (after times T0 and T1), memory device 200 can program memory cell 212 of memory cell strings $230_1$ when voltage V3 (provided by signal WL2) is applied to access line 252a. During a time interval between times T1 and T2 (between programming of memory cell 212 of memory cell strings $230_0$ and programming of memory cell 212 of memory cell string $230_1$) signal WL2 can be provided with either voltage V0 (e.g., zero volts) or voltage Vx (which is less than voltage V3).

Between times T4 and T6 (write verify stage), which is after times T0 to T3, memory device 200 can determine whether each of memory cells 212 of memory cell strings $230_0$ and $230_1$ reaches a target state when voltage V4 (provided by signal WL2) is applied to access line 252a. For example, between times T4 and T5, memory device 200 can determine whether memory cell 212 of memory cell string $230_0$ reaches a target state. Between times T5 and T6, memory device 200 can determine whether memory cell 212 of memory cell string $230_1$ reaches a target state. During a time interval between times T4 and T6 (write verify stage), memory device 200 can keep the value of voltage V4 (e.g., program verify voltage) unchanged. Thus, in a write verify stage, memory device 200 can apply voltage V4 to access line 252a (FIG. 2A) without applying another voltage to access line 252a (e.g., without resetting the voltage (V4) on access line 252a to V0 at time T5).

As shown in FIG. 4A, signals WL0, WL1, and WL3 (associated with unselected access lines 250a, 251a, and 253a, respectively, of FIG. 2A) can be provided with voltage V2 during a time interval between times T0 and T1 and between times T2 and T3. During a time interval between times T1 and T2 (which is a time interval between programming of memory cells 212 of memory cell strings $230_0$ and $230_1$) signals WL0, WL1, and WL3 can be provided with either voltage V0 (e.g., zero volts) or voltage Vy (which is less than voltage V2). During time interval between times T4 and T6 (write verify stage), memory device 200 can keep a value of voltage V5 (e.g., program verify voltage) unchanged. Thus, in a write verify stage, voltage V5 can be applied to access lines 250a, 251a, and 253a (FIG. 2A) without applying another voltage to access lines 250a, 251a, and 253a during a time interval between times T4 and T5 and times T5 and T6.

Other signals BL0, SGS, SL, $EN_{BUFFER\_0}$, and $EN_{BUFFER\_1}$ can be deactivated (e.g., provided with voltage V0) or activated (e.g., provided with a voltage different from voltage V0) as shown in FIG. 4A. For example, signal BL0 can be provided with voltage V8 (e.g., Vss or alternatively, a voltage slightly greater than Vss, such as a voltage between 0 and 1V) if memory cell 212 of memory cell string $230_0$ (or memory cell string $230_1$) is to be programmed (e.g., programmed to a target state). Signal BL0 can be provided with voltage V7 (e.g., program inhibit voltage, such as Vcc) if memory cell 212 of memory cell string $230_0$ (or memory cell string $230_1$) reaches the target state (e.g., not to be programmed). Signal SGS can be activated (e.g., provided with voltage V1) in the write verity stage between times T4 and T6. Signal SL can be activated (e.g., provided with voltage V1) the write stage between times T0 and T3 for increasing the threshold voltages of transistors 261, 261, 263, and 264 by the back bias effect, and also for suppressing the punch-through voltages of transistors 261, 261, 263, and 264 for the program inhibiting memory cell strings during programming.

Signals SGD0 and SGD1 can be sequentially activated (e.g., can be provided with voltage V6) between times T0 and T3 (write stage). For example, signal SGD0 can be activated between times T0 and T1 and signal SGD1 can be activated between times T2 and T3. This allows memory cell 212 of memory cell string $230_0$ to be programmed between times T0 and T1 and memory cell 212 of memory cell string $230_1$ to be programmed between times T2 and T3. Signals SGD0 and SGD1 can also be sequentially activated between times T4 and T6 (write verify stage). For example, signal SGD0 can be activated between times T4 and T5 and signal SGD1 can be activated between times T5 and T6. This allows memory device 200 to determine whether memory cells 212 of memory cell strings $230_0$ and $230_1$ reach a target state (e.g., a target threshold voltage).

Signals $EN_{BUFFER\_0}$ and $EN_{BUFFER\_1}$ can be sequentially activated (e.g., can be provided with voltage V9) between times T4 and T6 (write verify stage) to pass signal BL0 to page buffers 240 and 241 at different time intervals. For example, signal $EN_{BUFFER\_0}$ can be activated between times T4 and T5 to pass signal BL0 to page buffer 240 between times T4 and T5. Signal $EN_{BUFFER\_1}$ can be activated between times T5 and T6 to pass signal BL0 to page buffer 241 between times T5 and T6. Between times T4 and T5, signal BL0 can carry information associated with the state (e.g., threshold voltage) of memory cell 212 of memory cell string $230_0$. Between times T5 and T6, signal BL0 can carry information associated with the state (e.g., threshold voltage) of memory cell 212 of memory cell string $230_1$. Thus, between times T4 and T6, page buffers 240 and 241 can contain information associated with the states of memory cells 212 of memory cell strings $230_0$ and $230_1$, respectively. Based on the information in page buffers 240 and 241 between times T4 and T6, memory device 200 can determine whether memory cells 212 of memory cell strings $230_0$ and $230_1$ reach a target state (e.g., a target threshold voltage).

Figure 4B:
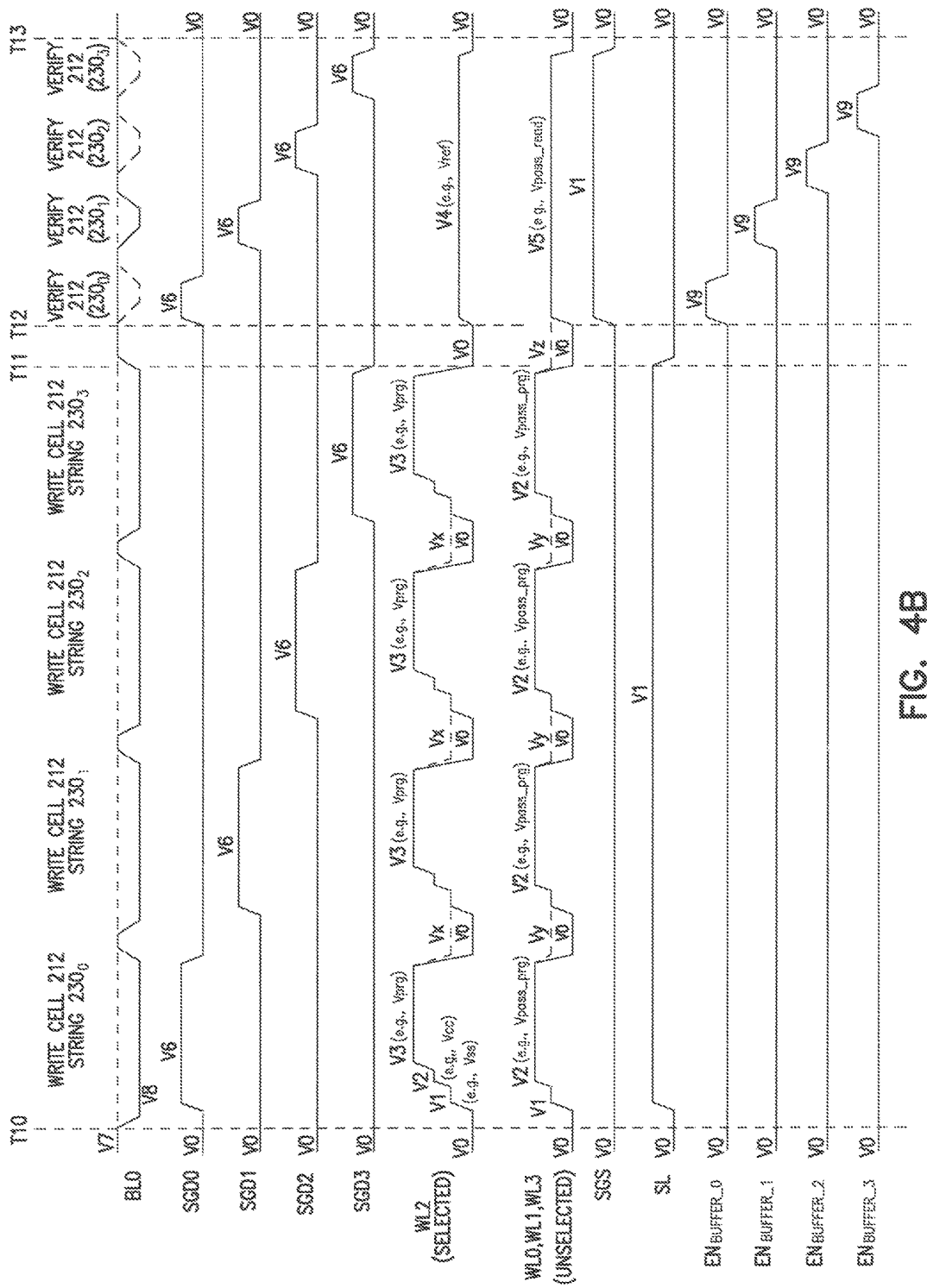
FIG. 4B is a variation of the example write operation associated with of FIG. 4A, according to an embodiment of the invention.

FIG. 4B is a variation of the example write operation associated with of FIG. 4A, according to an embodiment of the invention. The example write operation of FIG. 4B is similar to that of the example write operation of FIG. 4A. Thus, detailed description of similar operations associated with FIG. 4A and FIG. 4B is not repeated in the description of FIG. 4B.

As shown in FIG. 4B, four memory cells (instead of two as in FIG. 4A) can be sequentially programmed in a write stage. Then, a write verify stage is performed to determine whether the four memory cells reach a target stage. The four memory cells in the example of FIG. 4B can include memory cells 212 of memory cell strings $230_0$, $230_1$, $230_2$, and $230_3$ (FIG. 2A). Memory device 200 of FIG. 4B can perform a write stage during a time interval between times T10 and T11 to sequentially program memory cells 212 of memory cell strings $230_0$, $230_1$, $230_2$, and $230_3$ when signal WL2 is provided with a voltage V3. Memory device 200 can perform a write verify stage during a time interval between times T12 and T13 to determine whether memory cells 212 of memory cell strings $230_0$, $230_1$, $230_2$, and $230_3$ (that were programmed between times T10 and T11) reach a target state.

The write and write verify stages between times T10 and T13 can correspond to the write and write verify stages between times Ta and Tc (FIG. 3B), between times Tc and Te, or between times Te and Tg.

As shown in FIG. 4B, signals SGD0, SGD1, SGD2, and SGD3 can be sequentially activated (e.g., can be provided with voltage V6) between times T10 and T11 (write stage). This allows memory cells 212 of memory cell string $230_0$, $230_1$, $230_2$, and $230_3$ to be sequentially programmed (e.g., one after another) between times T10 and T11. Signals SGD0, SGD1, SGD2, and SGD3 can also be sequentially activated between times T12 and T13 (write verify stage). This allows memory device 200 to determine whether memory cells 212 of memory cell string $230_0$, $230_1$, $230_2$, and $230_3$ reach a target state (e.g., a target threshold voltage).

Signals $EN_{BUFFER\_0}$, $EN_{BUFFER\_1}$, $EN_{BUFFER\_2}$, and $EN_{BUFFER\_3}$ can be sequentially activated (e.g., can be provided with voltage V9) between times T12 and T13 (write verify stage) to pass signal BL0 to page buffers 240, 241, 242, and 243 at different time intervals. Between times T12 and T13, memory device 200 can determine whether memory cells 212 of memory cell string $230_0$, $230_1$, $230_2$, and $230_3$ reach a target state based on the information in page buffers 240, 241, 242, and 243 between times T12 and T13.

Figure 5:
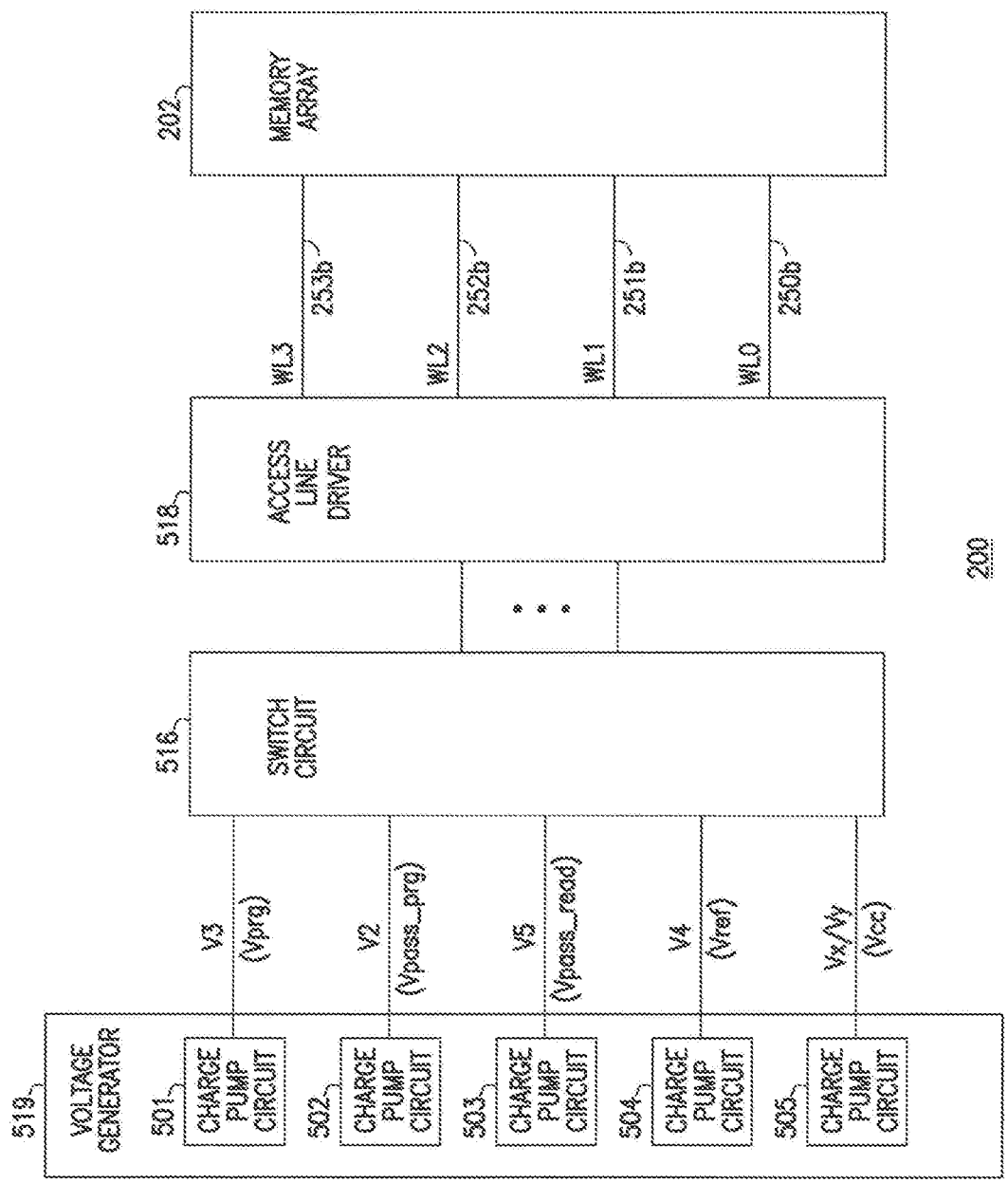
FIG. 5 shows a block diagram of a portion of the memory device of FIG. 2A and FIG. 2B including charge pump circuits, according to an embodiment of the invention.

FIG. 5 shows a block diagram of a portion of the memory device 200 of FIG. 2A and FIG. 2B including charge pump circuits 501, 502, 503, 504, and 505, according to an embodiment of the invention. As shown in FIG. 5, memory array 202 and access lines 250a, 251a, 252a, and 253a of memory device 200 can be coupled to an access line driver 518, which can be part of a decoder (e.g., a row decoder) of memory device 200. Memory device 200 can include a switch circuit 516 to selectively provide (e.g., switch) access lines 250a, 251a, 252a, and 253a (through access line driver 518) with different voltages depending on which operation memory device 200 performs.

Charge pump circuits 501 through 505 can be included in a voltage generator 519, which can correspond to voltage generator 119 of FIG. 1. As shown in FIG. 5, charge pump circuits 501 through 505 can generate corresponding voltages V3 (e.g., Vprg), V2 (e.g., Vpass_prg), V4 (e.g., Vref), V5 (e.g., Vpass_read), and Vx or Vy (which can have a value corresponding to Vcc).

In a write operation, memory device 200 can cause switch circuit 516 to apply voltage V3, V2, V4, V5, Vx, and Vy to access lines 250a, 251a, 252a, and 253a (associated with signals WL), WL1, WL2, and WL3, respectively) in fashions similar to or identical to those described above with reference to FIG. 4A through FIG. 4B. For example, in a write operation, memory device 200 can cause switch circuit 516 to switch voltage V3 to voltage Vx applied to access line 252a (e.g., selected access line) during a write stage between times T0 and T3 (FIG. 4A). Memory device 200 can cause switch circuit 516 to switch voltage V2 to voltage Vy applied to access lines 250a, 251a, and 253a (e.g., unselected access lines) during a write stage between times T0 and T3 (FIG. 4A).

In another example, in a write operation, memory device 200 can cause switch circuit 516 to apply voltage V4 to access line 252a (e.g., selected access line) during a write verify stage between times T4 and T6 (FIG. 4A) without causing switch circuit 516 to switch voltage V4 to another voltage (e.g., V0). Memory device 200 cause switch circuit 516 to apply voltage V5 to access lines 250a, 251a, and 253a (e.g., unselected access lines) during a write verify stage between times T4 and T6 (FIG. 4A) without causing switch circuit 516 to switch voltage V5 to another voltage (e.g., V0).

FIG. 6 shows a side view of a structure of a portion of a memory device 600, according to an embodiment of the invention. Memory device 600 can include a memory device described above with reference to FIG. 1 through FIG. 5, such as memory device 200 (FIG. 2A). Thus, similar or identical elements (e.g., memory cells, data lines, control gates) between memory device 200 and memory device 600 are given the same designation labels.

As shown in FIG. 6, memory device 600 can include a substrate 690 where memory cell string $230_0$ can be formed over substrate 690. FIG. 6 shows only one memory cell string $230_0$. Other memory cell strings of memory device 600 can be formed over substrate 690 and can have a structure similar to or identical to that of memory cell string $230_0$. Substrate 690 can include a monocrystalline (also referred to as single-crystal) semiconductor material (e.g., single-crystal silicon). The monocrystalline semiconductor material of substrate 690 can include impurities, such that substrate 690 can have a specific conductivity type (e.g., n-type or p-type).

As shown in FIG. 6, memory cells 210, 211, 212, and 213 can be located in different levels 621, 622, 623, and 624, respectively, in a z-direction of memory device 200. The z-direction can extend in a direction. (e.g., vertical direction) associated with the thickness of substrate 690. FIG. 6 also shows an x-direction, which can extend in a direction (e.g., horizontal) perpendicular to the z-direction.

Memory cell string $230_0$ can include a body 640 having a portion 641 coupled to data line 270 and a portion 642 coupled to line 299. Body 640 can include a conductive material that is capable of providing a conduction of current between data lines 270 and 299. Portions 641 and 642 can include materials of different conductivity types. For example, portion 641 can include a semiconductor material of n-type, and portion 642 can include a semiconductor material of p-type. The semiconductor material can include polycrystalline silicon.

Control gates 250b, 251b, 252b, and 253b can be located along at least a portion (e.g., portion 642) of body 640 in the z-direction. The materials of control gates 250b, 251b, 252b, and 253b can include a conductive material (e.g., conductively doped polycrystalline silicon or other conductive material).

Memory cell string $230_0$ can include materials 603, 604, 605 between a portion of body 640 and each of control gates 250b, 251b, 252b, and 253b. Material 605 can also be between body 640 and each of gates 280b and 284b. As shown in FIG. 6, materials 603, 604, and 605 can be separated among memory cells 210, 211, 212, and 213.

Material 603 can include a charge blocking material(s) (e.g., a dielectric material such as silicon nitride) that is capable of blocking a tunnel of a charge.

Material 604 can include a charge storage material(s) that can provide a charge storage function to represent a value of information stored in memory cell 210, 211, 212, and 213. For example, material 604 can include conductively doped polycrystalline silicon, which can be either a p-type polycrystalline silicon or an n-type polycrystalline silicon. The polycrystalline silicon can be configured to operate as a floating gate (e.g., to store charge) in a memory cell (e.g., a memory cell 210, 211, 212, or 213).

Material 605 can include a tunnel dielectric material(s) (e.g., an oxide of silicon) that is capable of allowing tunneling of a charge (e.g., electrons).

Line 299 can be formed over substrate 690. Line 299 and portion 642 of body 640 can include materials of different conductivity types. For example, line 299 can include a semiconductor (e.g., polycrystalline silicon) material of n-type, and portion 642 can include a semiconductor (polycrystalline silicon) material of p-type.

Line 299 and portion 641 of body 640 can include materials of the same conductivity type (e.g., polycrystalline silicon of n-type). As shown in FIG. 6, portions 641 and 642 can contact each other and form a junction (e.g., p-n junction) 643. Portion 642 and line 299 can contact each other and form a junction (e.g., p-n junction) 644.

FIG. 6 shows line 299 formed over substrate 690 as an example. In an alternative arrangement, line 299 can be formed in a portion of substrate 690. For example, line 299 can be a part of substrate 690 that is doped with impurities to create a conductivity type (e.g., n-type or p-type) different from another part of substrate 690.

Memory device 600 can include a voltage generator 619 and buffer circuitry 620 located over (e.g., formed in or formed on) a portion of substrate 690. Buffer circuitry 620 can include buffer circuits, such as buffer circuits 220, 221, and 222 of memory device 200 (FIG. 2A). Voltage generator 619 can include charge pump circuits, such as charge pump circuits 501 through 505 (FIG. 5). Memory device 600 can include conductive paths (not shown in FIG. 6) to couple voltage generator 619 and buffer circuitry 620 to other elements of memory device 600 (e.g., to control gates 250*b*, 251*b*, 252*b*, and 253*b* and data line 270). Memory device 600 can be configured to perform memory operations (e.g., read, write, and erase operations) similar to or identical to those described above with reference to FIG. 1 through FIG. 5.

FIG. 7 shows a memory device 700, which can be variation of memory device 600 of FIG. 6, according to an embodiment of the invention. As shown in FIG. 7, memory device 700 can include elements that are similar to or identical to those of memory device 600 of FIG. 6. For simplicity, similar or identical elements between memory devices 600 and 700 are not repeated in the description with reference to FIG. 7. As shown in FIG. 7, materials 603, 604, and 605 are not separated (e.g., continuous) among memory cells 210, 211, 212, and 213. Material 604 of FIG. 7 can be different from material 604 of FIG. 6. For example, material 604 of FIG. 7 can include charge trapping materials, such as silicon nitride.

Figure 8:
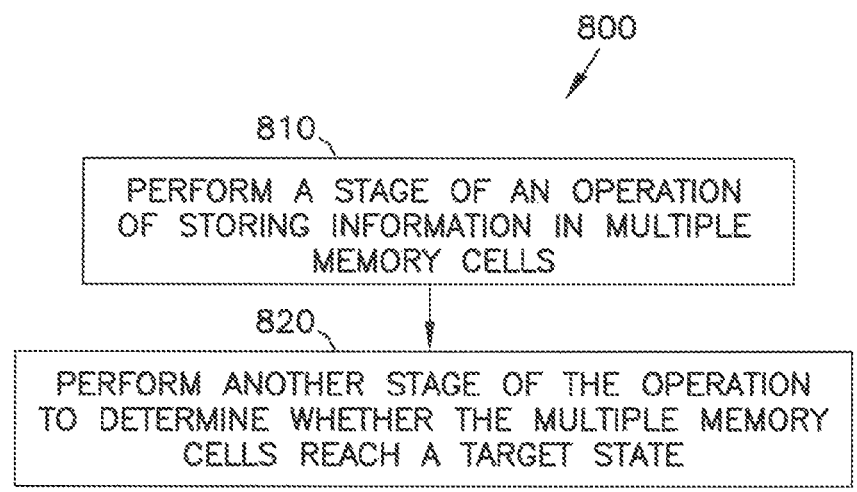
FIG. 8 is a flow diagram for a method of performing a write operation in a memory device, according to an embodiment of the invention.

FIG. 8 is a flow diagram for a method 800 of performing a write operation in a memory device, according to an embodiment of the invention. Method 800 can be used in a memory device such as memory device 100 (FIG. 1), memory device 200 (FIG. 2A), memory device 600 (FIG. 6), and memory device 700 (FIG. 7).

As shown in FIG. 8, activity 810 of method 800 can include performing a stage (e.g., a write stage) of an operation of storing information in multiple memory cells. Activity 820 of method 800 can include performing another stage (e.g., a write verify stage) of the operation (after the stage performed in activity 810) in order to determine whether the multiple memory cells reach a target state (e.g., a target threshold voltage). The multiple memory cells in activities 810 and 820 can be included in different memory cell strings coupled to the same data line. Each of the memory cell strings can be coupled to the data line through a respective select transistor (e.g., an SGD transistor).

Method 800 can include fewer or more activities relative to activities 810 and 820 shown in FIG. 8. For example, method 800 can include activities and operations of a write operation described above with reference to FIG. 1 through FIG. 5.

The illustrations of the apparatuses (e.g., memory devices 100, 200, 600, and 700) and methods (e.g., method 800 and operations performed by memory devices 100, 200, 600, and 700) are intended to provide a general understanding of the structure of various embodiments and are not intended to provide a complete description of all the elements and features of an apparatus that might make use of the structures described herein.

The apparatuses (e.g., memory devices 100, 200, 600, and 700 or part of memory devices 100, 200, 600, and 700, including memory control unit 118 (FIG. 1), voltage generators 119, 519, and 619; buffer circuitry 120 and 620; and buffer circuits 220, 221, and 222, described above, may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

Memory device 100, 200, 600, or 700 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses and methods for performing a first stage of an operation of storing information in a first memory cell and a second memory cell, and performing a second stage of the operation after the first stage to determine whether each of the first and second memory cells reaches a target state. The first memory cell is included in a first memory cell string coupled to a data line through a first select transistor. The second memory cell is included in a second memory cell string coupled to the data line through a second select transistor. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:
1. An apparatus comprising:
a data line;
a first memory cell included in a first memory cell string;
a second memory cell included in a second memory cell string;
a first select transistor coupled between the data line and the first memory cell string;

a second select transistor coupled between the data line and the second memory cell string;

an access line shared by the first and second memory cells; and a module to perform a first stage of an operation of storing information in the first and second memory cells, and to perform a second stage of the operation after the first stage to determine whether each of the first and second memory cells reaches a target state.

2. The apparatus of claim 1, wherein the module is to change a state of each of the first and second memory cells during the first stage and before the second stage is performed.

3. The apparatus of claim 1, wherein the module is to change the state of each of the first and second memory cells from a state corresponding a negative threshold voltage value to a state corresponding a positive threshold voltage value.

4. The apparatus of claim 2, wherein the state of each of the first and second memory cells includes an erase state before the first stage is performed.

5. The apparatus of claim 1, wherein the module is to:

determine, during a first time interval of the second stage, whether the first memory cell reaches the target state; and determine, during a second time interval of the second stage, whether the second memory cell reach the target state.

6. The apparatus of claim 5, wherein the module is to:

apply, during the first time interval and the second time interval, a program verify voltage to the access line coupled to the first and second memory cells; and keep a value of the program verify voltage unchanged between the first and second time intervals.

7. The apparatus of claim 1, further comprising:

a first buffer coupled to the data line through a transistor; and a second buffer coupled to the data line through the transistor.

8. The apparatus of claim 7, further comprising:

a third buffer coupled to the data line through the transistor; and a fourth buffer coupled to the data line through the transistor.

9. The apparatus of claim 1, wherein each of the first and second memory cells is configured as a single level cell, and the target state corresponds to a value of a single bit of data.

10. The apparatus of claim 1, wherein each of the first and second memory cells is configured as a multi-level cell, and the target state corresponds to a value of one bit among the multiple bits to be stored in each of the first and second memory cells.

11. An apparatus comprising:

a data line;

a first memory cell string coupled to the data line, the first memory cell string including a first memory cell;

a second memory cell string coupled to the data line, the second memory cell string including a second memory cell;

an access line shared by the first and second memory cells; and a module to:

apply a first voltage to the access line during a first time interval of an operation to program a first memory cell;

apply the first voltage to the access line during a second time interval of the operation to program the second memory cell; and apply a second voltage to the access line during a third time interval and a fourth time interval of the operation after the second time interval to determine whether the first and second memory cells reach a target threshold voltage.

12. The apparatus of claim 11, wherein the module is to apply a third voltage to the access line during a time interval between the first and second the time intervals, wherein a value of the third voltage is less than a value of the first voltage.

13. The apparatus of claim 12, wherein the value of the third voltage is zero.

14. The apparatus of claim 12, wherein the value of the third voltage is greater than zero.

15. The apparatus of claim 11, wherein the module is to:

couple the data line to a first page buffer during the third time interval to determine whether the first memory cell reaches the target threshold voltage based on information provided from the data line to the first page buffer during the third time interval; and couple the data line to a second page buffer during the fourth time interval to determine whether the second memory cell reaches the target threshold voltage based on information provided from the data line to the second page buffer during the fourth time interval.

16. An apparatus comprising:

a data line;

a first memory cell string coupled to the data line, the first memory cell string including a first memory cell;

a second memory cell string coupled to the data line, the second memory cell string including a second memory cell;

an access line shared by the first and second memory cells; and a module to sequentially store information in the first and second memory cells during a first time interval, and to sequentially verify during a second time interval after the first time interval whether the first and second memory cells reach their respective target states.

17. The apparatus of claim 16, further comprising:

a first buffer coupled to the data line to contain information associated with a state of the first memory cell after the first memory cell is programmed; and a second buffer coupled to the data line to contain information associated with a state of the second memory cell after the second memory cell is programmed.

18. The apparatus of claim 16, wherein the module is to:

apply a program verify voltage to the access line during the second time interval; and keep a value of the program verify voltage unchanged during the second time interval.

19. The apparatus of claim 16, further comprising:

a third memory cell string coupled to the data line, the third memory cell string including a third memory cell;

a fourth memory cell string coupled to the data line, the fourth memory cell string including a fourth memory cell, wherein:

the access line is shared by the first, second, third, and fourth memory cells; and the module is to sequentially store information in the first, second, third, and fourth memory cells during the first time interval, and to sequentially verify during the second time interval whether the first, second, third, and fourth memory cells reach their respective target states.

20. The apparatus of claim 19, further comprising:
a first buffer coupled to the data line to contain information associated with a state of the first memory cell after the first memory cell is programmed;
a second buffer coupled to the data line to contain information associated with a state of the second memory cell after the second memory cell is programmed;
a third buffer coupled to the data line to contain information associated with a state of the third memory cell after the third memory cell is programmed; and
a fourth buffer coupled to the data line to contain information associated with a state of the fourth memory cell after the fourth memory cell is programmed.

* * * * *